United States Patent
Miao (10) Patent No.: US 8,477,822 B2
(45) Date of Patent: Jul. 2, 2013

(54) COMPACT TRANSISTOR OUTLINE PACKAGED LASER WITH OPTICAL MONITORING FUNCTION

(75) Inventor: Rongshong Miao, San Jose, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 13/223,496

(22) Filed: Sep. 1, 2011

(65) Prior Publication Data

US 2012/0051382 A1     Mar. 1, 2012

Related U.S. Application Data (60) Provisional application No. 61/379,014, filed on Sep. 1, 2010.

(51) Int. Cl.
*H01S 5/00* (2006.01)
(52) U.S. Cl.
USPC ............. 372/50.21; 372/50.23; 372/50.1
(58) Field of Classification Search
USPC .................. 372/50.21, 50.1, 50.23
See application file for complete search history.

(56) References Cited

U.S. PATENT DOCUMENTS

| | | | |
|---|---|---|---|
| 7,118,292 B2 | 10/2006 | Miao et al. | |
| 2003/0151818 A1* | 8/2003 | Wagner et al. | 359/578 |
| 2003/0169788 A1 | 9/2003 | Yokoyama | |
| 2006/0147150 A1* | 7/2006 | Epitaux | 385/14 |
| 2006/0165353 A1* | 7/2006 | Miao et al. | 385/88 |
| 2008/0317078 A1 | 12/2008 | Park et al. | |

FOREIGN PATENT DOCUMENTS

WO    03/046630 A1    6/2003

OTHER PUBLICATIONS

Foreign communication from a counter-part application, PCT application PCT/US2011/050136, International Search Report dated Jan. 30, 2012, 5 pages.
Foreign communication from a counter-part application, PCT application PCT/US2011/050136, Written Opinion dated Jan. 30, 2012, 9 pages.

* cited by examiner

*Primary Examiner* — Kinam Park
(74) *Attorney, Agent, or Firm* — Conley Rose, P.C.; Grant Rodolph; Rayhao Chung (57) ABSTRACT

An apparatus comprising a header comprising a platform for attaching opto-electronic components, an optical element, a laser diode (LD) configured to emit an optical signal that passes through the optical element, and a cap affixed to the header such that the cap is coaxially aligned with the header, wherein the cap and header encase the optical element and the LD.

21 Claims, 5 Drawing Sheets

COMPACT TRANSISTOR OUTLINE PACKAGED LASER WITH OPTICAL MONITORING FUNCTION

CROSS-REFERENCE TO RELATED APPLICATIONS

The present application claims the benefit of U.S. Provisional Patent Application No. 61/379,014, filed Sep. 1, 2010 by Rongsheng Miao, and entitled "Compact Transmitter Optical Laser with Optical Monitoring Function," which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

In modern wavelength division multiplexed (WDM) optical networks, an optical transceiver may need to tune and/or stabilize its optical signal wavelength in response to changing environmental/operating conditions, e.g., temperature fluctuations, non-ideal component performance due to deterioration and/or manufacture defect, etc. For instance, an optical transceiver may manipulate one or more characteristics of their optical transmitter, e.g., bias current, temperature, etc., so as to maintain their optical signal wavelength within an assigned channel. In some WDM networks, e.g., dense WDM (DWDM) networks, the spacing between channels may be relatively narrow such that even minor optical signal deviations may result in crosstalk and/or interference between neighboring channels. Hence, a significant design goal for modern optical transceivers may be to include appropriate functionality for wavelength stabilization.

Figure 1:
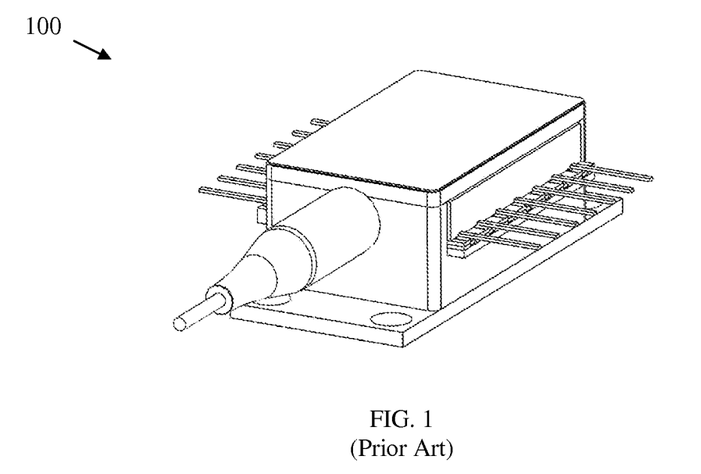
FIG. 1 illustrates the external characteristics of a prior-art butterfly package.
Figure 2:
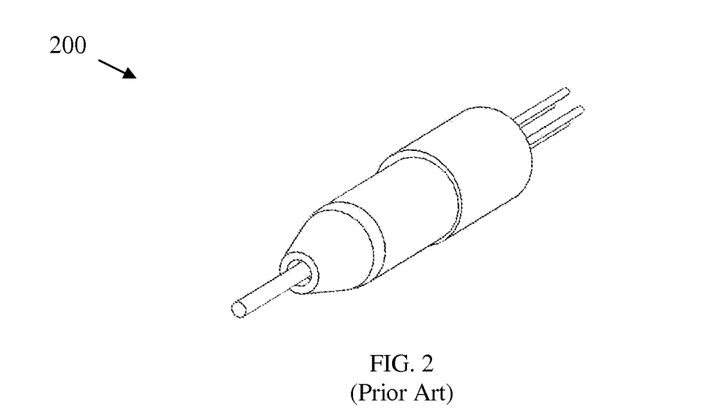
FIG. 2 illustrates the external characteristics of a prior art TO-can package.

Another significant design concern for modern optical transceivers may be cost, as optical transceivers may represent a substantial portion of overall network cost. The most costly component in many optical transceivers is the transmitter optical module, which may be responsible for converting an electrical signal into an optical signal. Transmitter optical modules may be commercially available in various different transmitter optical sub-assembly (TOSA) packages, such as a butterfly package 100 as illustrated in FIG. 1 or a transistor outline (TO) can (TO-can) package 200 as illustrated in FIG. 2.

SUMMARY

In one embodiment, the disclosure includes an apparatus comprising a header comprising a platform for attaching opto-electronic components, an optical element, a laser diode (LD) configured to emit an optical signal that passes through the optical element, and a cap affixed to the header such that the cap is coaxially aligned with the header, wherein the cap and header encase the optical element and the LD.

In another embodiment, the disclosure includes a transistor outline (TO-can) package, comprising a header, a cap coupled to the header and coaxially aligned to the header, an optical element mounted inside a cavity formed between the cap and header, a laser diode (LD) mounted inside the cavity formed between the cap and header and configured to emit an optical signal that passes through the optical element, and a photodiode (PD) mounted inside the cavity formed between the cap and header and configured to monitor the optical signal after the optical signal emerges from the optical element.

In yet another embodiment, the disclosure includes an opto-electronic package, comprising a header for mounting opto-electronic components, a cap affixed to the header such that the cap and the header are coaxially aligned, a laser diode (LD) configured to emit a first optical signal from a front facet and a second optical signal from a rear facet, and wherein the first optical signal and the second optical signal comprise substantially similar optical characteristics, a first photodiode (PD) configured to determine the second optical signal's wavelength, an optical element configured to filter the first optical signal, wherein the temperature of the optical element is regulated based on the optical element's performance, and a second PD configured to determine the first optical signal's wavelength as the first optical signal emerges from the optical element, wherein the optical element's performance is determined by comparing the first optical signal's wavelength with the second optical signal's wavelength, and wherein each of the LD, the first PD, the optical element, and the second PD are encased within a cavity formed between the cap and the header.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Generally speaking, the butterfly package 100 may have greater functionality than the TO-can 200, but may also be more expensive as well as less compact. Specifically, the TO-can package 200 may be manufactured using less expensive processes and less expensive materials than the butterfly package 100. For instance, in some embodiments, to make the TO-can package 200, only metal punching and glass sealing may be required, while to make butterfly package 100, ceramic metallization, ceramic co-firing and ceramic dicing as well as metal cutting and brazing are required. The above mentioned ceramic manufacturing processes make the ceramic components used in the butterfly package 100 much more costly than glass typically used in TO-can package 200. In addition, hermetically sealing the leads of the TO-can package 200 to its metallic header may be accomplished using a relatively simplistic glass-to-metal sealing technique, while hermetically sealing the leads of the butterfly package 100 to its shell may require a comparatively more complex ceramic feed through sealing and metal brazing techniques. Additionally and by virtue of their respective designs, the butterfly package 100 may be substantially wider and/or thicker than the TO-can package 200, thereby making it considerably less compact. These and other advantageous characteristics of the TO-can package 200 may be described in U.S. Pat. No. 7,118,292, which is incorporated herein by reference as if reproduced in its entirety. Hence, the TO-can 200 may be preferable to the butterfly package 100 so long as the TO-can package 200 provides the required functionality for a given network application. Consequently, one design objective for new TO-can packages may be to include components that provide additional functionality without substantially increasing the cost or relative compact size of the TO-can package.

As used herein, a TO-can package includes a header (also referred to as a header platform) and a cap which are coaxially aligned with each other as well as opto-electronic components encased within a cavity formed by the header and the cap. In some embodiments, the opto-electronic components may be mounted to or otherwise affixed to the header and/or cap. The cap may be affixed to the header to form a seal thereby encapsulating the opto-electronic components within the header and cap to form a functional package. The terms TO-can package, TO-package, and coaxial package are used interchangeably throughout this disclosure. In some embodiments, the cap and header do not include ceramic material. In some embodiments, the cap and header may be a metallic material, such as, for example, stainless steel.

Figure 3:
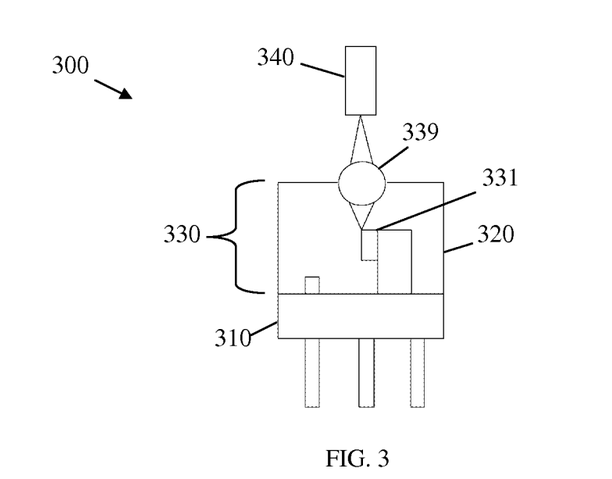
FIG. 3 illustrates an un-cooled TOSA comprising a TO-can package.

FIG. 3 illustrates an un-cooled TOSA 300 comprising a header 310 that is affixed to a cap 320 forming a TO-can package 330, and an optical fiber 340. The term "TO-can package" may be used herein to refer to the cavity formed between a header and a cap in a TOSA configuration, and may be related specifically to compact TOSA architectures (e.g., FIG. 2) rather than less compact TOSA architectures (e.g., FIG. 1). In an embodiment, the header 310 may be hermetically sealed to the cap 320 such that the TO-can package 330 is isolated from the exterior of the cap 320. For instance, the TO-can package 330 may be substantially air-tight such that gas is largely prevented from entering or exiting the TO-can package 330. In an embodiment, the TO-can package 330 may be filled (partially or completely) with a non-conductive resin that is transparent to the optical wavelengths used by the TOSA 300. The non-conductive resin may serve to electrically insulate the TO-can package 330, while allowing heat to be dissipated throughout the TO-can package 330, but may not adversely affect the optical signal's propagation through the TO-can package 330. In other embodiments, the TO-can package 330 may be filled with gas, e.g., nitrogen, helium, etc.

The TO-can package 330 may comprise a plurality of components, including (but not limited to) a laser diode (LD) 331 and a lens 339. The LD 331 may be any component configured to generate an optical signal, and the lens 339 may be any component capable of focusing the optical signal into the optical fiber 340. In an embodiment, the lens 339 may be suspended within the TO-can package 330. In another embodiment, the lens 339 may be hermetically seated within the cap 320, e.g., hermetically bonded within a recessed seat of the cap 320.

In some embodiments, the LD's 331 optical signal wavelength may be coarsely or approximately tuned (e.g., tuned with relatively low precision) by varying the bias current of the LD 331. However, such coarse tuning may lack the necessary precision to stabilize the optical signal wavelength within acceptable margins (e.g., within its assigned channel) as environmental/operating conditions change. For instance, the LD 331 may operate in various thermal conditions, e.g., between about −40° Celsius (C.) and about 85° C., and may be unable to stabilize the emitted wavelength in the event of moderate to severe temperature fluctuations. As such, optical wavelength stability may be substantially improved by regulating the temperature of the LD 331. However, the un-cooled TO-can package 330 may lack the components necessary to offer on-board temperature regulation functionality, and hence may need to rely on an external means of temperature regulation, e.g., an external/separate thermoelectric cooler (TEC) housed within (or in close proximity) to the optical transceiver. However, external TECs may increase the cost and/or complexity of the optical transceiver. As such, some TO-can packages may comprise internal components that offer on-board temperature regulation functionality.

Figure 4:
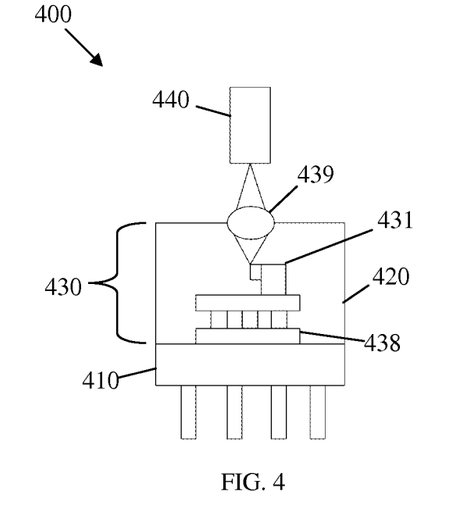
FIG. 4 illustrates a laser cooled TOSA comprising a TO-can package.

FIG. 4 illustrates a laser cooled TOSA 400 comprising a header 410, a cap 420, a TO-can package 430, and an optical fiber 440. The header 410, the cap 420, and the optical fiber 440 may be similar to the header 310, the cap 320, and the optical fiber 340 of the un-cooled TOSA 300. Further, the TO-can package 430 may be similar in many respects to the TO-can package 330, and may comprise an LD 431 and a lens 439 that are similar to the LD 331 and the lens 339, respectively. However, unlike the TO-can package 330, the TO-can package 430 may further comprise an internal TEC 438 for regulating the temperature of the LD 431. For instance, the TEC 438 may regulate the temperature of the LD 431 at a constant temperature, or alternatively, may adjust the temperature of the LD 431 based on a feed-back mechanism, e.g., based on a detected optical signal wavelength. Consequently, the laser cooled TO-can package 430 may be implemented without using an external/standalone TEC, and therefore may reduce the overall complexity and/or cost of the corresponding optical transceiver.

The TEC's 438 heating/cooling of the LD 431 may have the ancillary affect of heating/cooling the other components within the TO-can package 430. For instance, heat generated from the TEC 438 may be dissipated throughout the TO-can package 430, thereby allowing the temperature of the TO-can package 430 to reach a state of quasi-equilibrium. Hence, the TEC 438 may indirectly regulate the temperature of the lens 439 by transferring heat through the TO-can package 430. However, there may exist a slight temperature differential (e.g., several degrees) between the lens 439 and the LD 431 due to thermal convection and/or thermal radiation occurring within the TO-can package 430. This slight temperature differential may adversely affect the focal performance of the lens 439, and may skew the optical signal's wavelength as it passes through the lens 439. As such, some TO-can packages may comprise further functionality for regulating the temperature of the lens.

Figure 5:
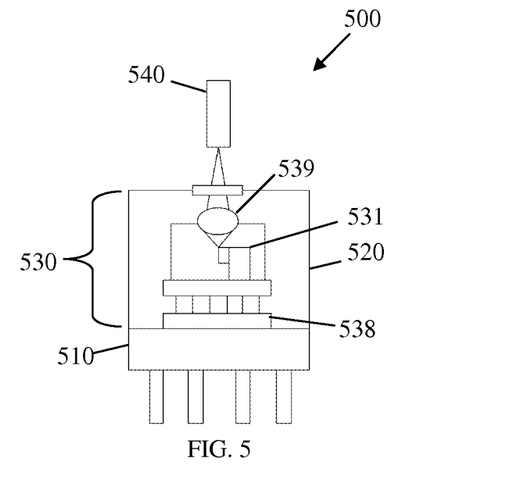
FIG. 5 illustrates a lens and laser cooled TOSA comprising a TO-can package.

FIG. 5 illustrates a lens and laser cooled TOSA 500 comprising a header 510, a cap 520, a TO-can package 530, and an optical fiber 540. The header 510, the cap 520, and the optical fiber 540 may be similar to the header 410, the cap 420, and the optical fiber 440 of the laser cooled TOSA 400. Further, the TO-can package 530 may be similar in many respects to the TO-can package 430, and may comprise an LD 531, a TEC 538, and a lens 539 that may be somewhat similar to the LD 431, the TEC 438, and the lens 439. However, unlike the TEC 438, the TEC 538 may directly regulate the temperature of the lens 539 (i.e., in addition to regulating the temperature of the LD 531) by directly heating/cooling the lens 539 via an appropriate thermal transfer medium (e.g., thermal probes) as demonstrated by the lines connecting the TEC 538 and the lens 539 in FIG. 5. Regulating the temperature of the lens 539 may allow the lens and laser cooled TOSA 500 to achieve greater wavelength stability than the laser cooled TOSA 400.

In addition to temperature regulation, some optical transceivers may use external optical elements, e.g., an optical filter, to further stabilize and/or enhance a TOSA's optical signal. Specifically, an optical element may be any optical component that is configured to monitor and/or improve the optical characteristics of an optical signal. For instance, an optical element may employ a thin film filter to improve spectral and/or dispersion characteristics of an optical signal, as well as a PD to monitor the same or other optical characteristics (e.g., wavelength, dispersion, spectral components, etc.). However, external optical elements may increase the overall cost and/or complexity of the optical transceiver. As such, a TO-can package design comprising an internal optical element as well as other optical monitoring components is desired to achieve a TO-can package with on-board optical monitoring functionality.

Disclosed herein is a TO-can package with on-board optical monitoring functionality. The TO-can package may comprise one or more internal optical elements, as well as additional optical monitoring components, e.g., one or more PDs. Specifically, the optical monitoring functionality may allow the TO-can package to internally monitor and/or improve one or more optical characteristics of the optical signal without relying on external means (e.g., without relying on components not encased within the TO-can package). Additionally, the temperature of one or more of the internal optical monitoring components may be regulated to achieve desired component performance and/or to achieve desired optical characteristics of the optical signal (e.g., desired wavelength, dispersion, spectrum, etc.). For instance, the temperature of the internal optical element may be regulated by a main TEC, e.g., the TEC that is used to cool the LD and/or lens, or alternatively by a micro-regulator, e.g., a micro-TEC or micro-resistive heater affixed to the internal optical element that is independent from the main TEC. The components that provide the optical monitoring functionality may be seamlessly integrated into the compact TO-can package configuration without substantially increasing the size of the TO-can package, e.g., in relation to other TO-can packages that lack optical monitoring functionality.

Figure 6:
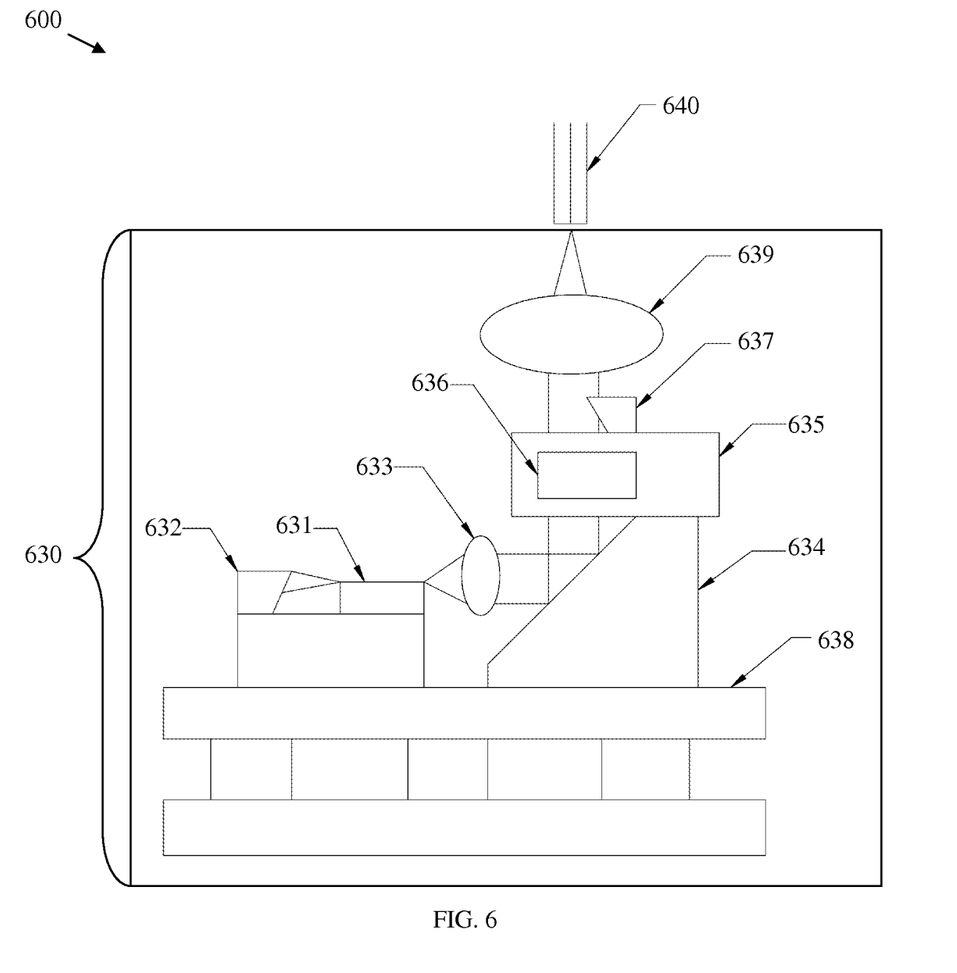
FIG. 6 illustrates an embodiment of a TOSA comprising a TO-can package with on-board optical monitoring functionality.

FIG. 6 illustrates an embodiment of a TOSA 600 comprising a TO-can package 630 with on-board optical monitoring functionality. The TO-can package 630 may comprise an LD 631, a first PD 632, a first lens 633, a mirror 634, an optical element 635, a micro-regulator 636, a second PD 637, a second lens 639, an optical fiber 640, and a TEC 638. The LD 631 may be any device capable of transmitting an optical signal, e.g., a distributed feedback (DFB) laser, a Fabry-Perot (FP) laser, etc. In an embodiment, the LD 631 may comprise a front facet and a rear facet. The LD 631 may be configured to emit a first optical signal out of the front facet (e.g., towards the first lens 633) and a second optical signal out of the rear facet (e.g., towards the first PD 632). The second optical signal may comprise substantially similar optical characteristics as the first optical signal such that the second optical signal is essentially a reflected carbon copy of the first optical signal. The first PD 632 may be any device capable of monitoring an optical signal. The PD 632 may be positioned behind the LD 631, and may be configured to monitor one or more characteristics of the second optical signal (e.g., wavelength, etc.). Hence, using the PD 632 to monitor the second optical signal may enable relatively accurate approximation of the corresponding characteristics of the first optical signal (i.e., which are substantially the same as those of the second optical signal) without affecting the power level of the first optical signal. In an embodiment, the PD 632 may be configured to provide wavelength tuning information to the LD 631 and/or to the TEC 638, such that the first optical signal may be fine tuned according to a feedback mechanism. For instance, the first optical signal may be tuned to the desired wavelength by first adjusting the bias current of the LD 631 and then adjusting the temperature of the LD 631 using the TEC 638. Hence, the first optical signal may be fine tuned through thermal regulation of the LD 631 using the TEC 638.

The first lens 633 may be a collimating lens that collimates the optical signal into a collimated optical signal, which may be an approximately parallel laser beam whose light rays are nearly collinear. Hence, the collimated optical signal may undergo minimal dispersion before reaching the second lens 639. Upon emerging from the first lens 633, the collimated optical signal may be directed into the first mirror 634 at an angle of approximately 45 degrees such that the collimated optical signal is reflected upwards, e.g., at approximately a 90 degree angle, towards the optical element 635. The optical element 635 may comprise any component configured to monitor and/or improve the optical characteristics of the laser beam. In an embodiment, the optical element 635 may comprise an optical filter (e.g., a thin film filter) made of transparent or semi-transparent material, e.g., fused silica, glass, etc., that is coated appropriately for the application. In an embodiment, the optical element 635 may improve the spectrum and/or dispersion characteristics of the laser beam.

Upon emerging from the optical element 635, the laser beam may be sampled by the second PD 637. Specifically, the second PD 637 may determine one or more characteristics (e.g., wavelength, dispersion, spectrum, etc.) of the laser beam, which may be indicative of the optical element's 635 effectiveness and/or performance. In some embodiments, the optical element's 635 performance may be affected by temperature fluctuation. For instance, a slight temperature deviation between the LD 631 and the optical element 635 (e.g., due to convection and/or radiation in the TO-can package 630) may alter optical properties of the optical element's 635 silica/glass, and consequently may result in a shifting of the optical signal's wavelength as the optical signal passes through the optical element 635. In such embodiments, the micro-regulator 636 may be used to micro-heat/cool the optical element 635 to reduce/eliminate the slight temperature fluctuation between the LD 631 and the optical element 635, thereby substantially reducing/eliminating a shifting of the optical signal's wavelength as the optical signal passes through the optical element 635. Hence, the micro-regulator 636, combined with the optical element 635, may provide a fine-tuning capability for the TOSA 600, thereby allowing further stabilization of the optical wavelength.

Figure 7:
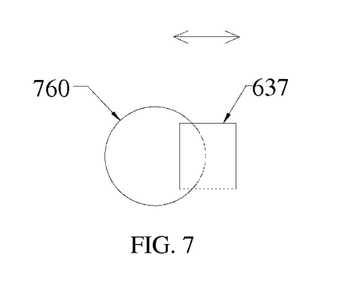
FIG. 7 illustrates a top profile of an adjustable edge-illuminated Photo Diode (PD).
Figure 8:
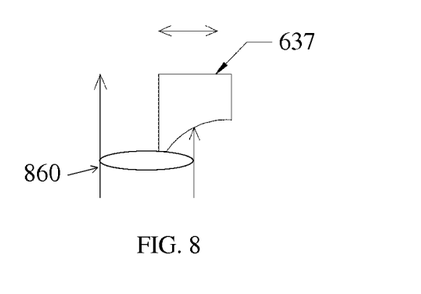
FIG. 8 illustrates a top profile of an adjustable edge-illuminated PD.

The second PD 637 may be edge-illuminated such that the second PD 637 catches only a portion of the collimated optical signal (e.g., the laser beam). FIG. 7 demonstrates an upper profile 700 of the second PD 637 and a laser beam 760. The laser beam 760 may correspond to the collimated optical signal emerging from the optical element 635. As demonstrated by the double-arrow, the second PD's 637 leading edge may be shifted closer to or further from the center of the laser beam 760, thereby allowing the second PD 637 to catch a larger or smaller portion of the laser beam 760. For instance, the second PD 637 may need to capture a certain amount of the laser beam 760 to effectively monitor the optical characteristics of the laser beam 760. Hence, catching too little of the laser beam 760 may prevent the second PD 637 from accurately gauging the characteristics of the collimated optical signal, e.g., which may be indicative of the optical element's 635 performance. However, catching too much of the laser beam 760 may unnecessarily attenuate the power level of the laser beam 760, thereby potentially decreasing the signal quality of the optical signal. Hence, the second PD 637 may be adjusted to an optimum position, where it catches enough of the laser beam 760 to effectively gauge the optical element's 635 performance without unnecessarily attenuating the laser beam 760. FIG. 8 shows a side profile 800 of the second PD 637 and the laser beam 760. As shown in FIG. 8, a portion of the laser beam 860 is captured by the second PD 637, while a portion of the laser beam 760 continues past the second PD 637, e.g., to the second lens 639 (e.g. focal lens) and then to the optical fiber 640.

Figure 9:
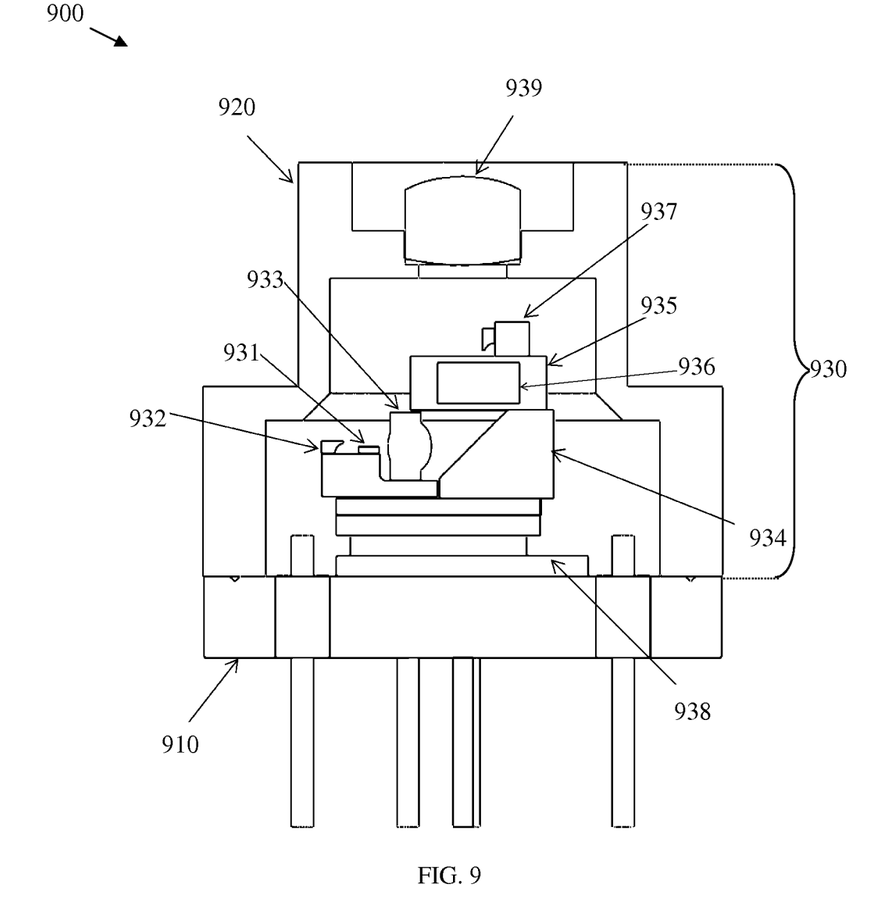
FIG. 9 illustrates another embodiment of a TOSA comprising a TO-can package with on-board optical monitoring functionality.

FIG. 9 illustrates another embodiment of a TOSA 900 comprising a header 910 affixed and a cap 920 to form a TO-can package 930. The TO-can package 930 may comprise an LD 931, a first PD 932, a first lens 933, a mirror 934, an optical element 935, a micro-regulator 936, a second PD 937, a TEC 938, and a second lens 939 that may be similar to corresponding components of the TO-can package 630. Specifically, the LD 931 may emit a first optical signal out of its front facet towards the first lens 933 and a second optical signal out of its rear facet towards the first PD 932. The first PD 932 may gauge characteristics (e.g., wavelength) of the second optical signal, which may correspond to characteristics of the first optical signal. The gauged characteristics may then be used by the TEC 938 to regulate the LD's 931 operating temperature to obtain a desired wavelength for the first optical signal. The first optical signal may be collimated by the lens 933 into a collimated optical signal, and then directed towards the mirror 934. The mirror 934 may reflect the collimated optical signal towards the optical element 935, which may monitor and/or improve the laser beam. Subsequently, the laser beam may be monitored by the second PD 937, e.g., to gauge the performance of the optical element 935. Finally, the laser beam may progress to the second lens 939, where the laser beam may be focused into a narrower beam of light before it emerges from the TO-package 930, e.g., before the narrowed beam is propagated through an optical fiber traversing an optical network.

Figure 10:
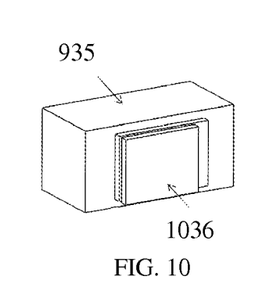
FIG. 10 illustrates an embodiment of an internal optical element comprising a micro-thermo-electric cooler (micro-TEC).
Figure 11:
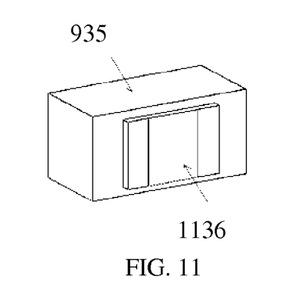
FIG. 11 illustrates an embodiment of an internal optical element comprising a micro-resistive-heater.

In some embodiments, the optical element 935 may comprise the micro-regulator 936, which may regulate the temperature of the optical element 935 according to a signal provided by the second PD 937. The micro-regulator 936 may comprise any means for micro-heating and/or micro-cooling the optical element 935. For instance, the optical element 935 may comprise a micro-TEC 1036 as shown in FIG. 10, or a micro-resistive heater 1136 as shown in FIG. 11. Alternatively, the TEC 938 may be configured to directly heat/cool the optical element 935, in which case the micro-regulator 936 may be omitted. Micro-cooling and/or micro-heating may place a relatively low thermal load on the micro-regulator 936 and/or the TEC 938 due to a combination of factors. For instance, there may be a relatively small temperature differential between the LD 931 and the optical element 935, e.g., about one or two degrees Celsius, the optical element 935 may comprise a relatively small volume of material in which to heat, and the optical element's material may be composed of material(s) that have a relatively low specific heat capacity, e.g., fused silica has a specific heat of approximately 700 Joules (J) per kilogram (Kg) Kelvin (K) ((J/(K*kg)). For example, the thermal load required to heat an optical element comprising a one by two by one millimeter (mm) (i.e., 1×2×1 mm) block of fused silica one degree may be in the hundreds of microwatts (μW), (e.g., have an order of magnitude that is about 10e-4 Watts for each degree K). Comparatively, the thermal load required to heat the LD 931 and other passive loads caused by convection and/or radiation may be ten times that of the thermal load required to heat the optical element 935, e.g., at least about one milliwatt (mW) per degree K.

In an embodiment, the optical element 935 may be bonded to the second PD 937 using an adhesive, such as a non-electrically-conductive epoxy that allows heat to flow from the optical element 935 and that is transparent to the desired optical wavelength. Hence, the micro-regulator 936 and/or the TEC 938 may directly heat/cool the second PD 937 in the process of heating/cooling the optical element 935. In some embodiments, one or both of the optical element 935 or the second PD 937 may be temperature insensitive, in which case the micro-regulator 936 may be omitted. The components that provide optical monitoring functionality (e.g., the first PD 932, the optical element 935, and/or the second PD 937) may be implemented in any TO-can package, including uncooled TO-can packages, laser cooled TO-can packages, and lens and laser cooled TO-can packages. Additionally, other components, e.g., the first PD 932, the first lens 933, the mirror 934, etc., may be cooled directly by the TEC 938 and/or comprise their own micro-regulators.

In an embodiment, the placement of the first PD 932 and/or the second PD 937 may enable on-board optical monitoring within the TO-can package 930 without the use of beam splitters. For instance, the first PD 932 may monitor the second optical signal emitted from the PD's 932 rear facet to provide on-board optical monitoring functionality without the use of an optical beam splitter (e.g., to split the first optical signal). Additionally, and as discussed above, the second PD 937 may be edge illuminated such that the only a portion of the first optical signal is captured by the second PD 937, thereby eliminating the need for a second beam splitter. In other words, the placement of the first PD 932 and the edge-illumination capability of the second PD 937 may eliminate the need for two optical beam splitters, thereby providing the same functionality using fewer components.

Figure 12:
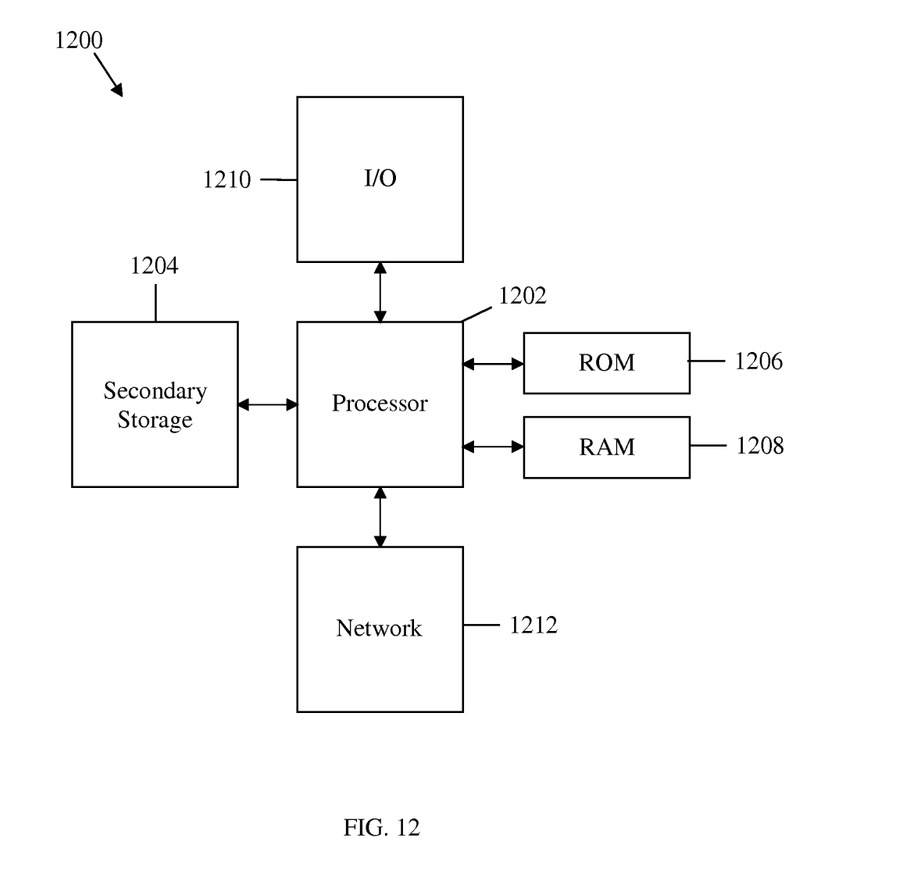
FIG. 12 is an embodiment of a general-purpose computer system.

FIG. 12 illustrates a typical, general-purpose computer, suitable for implementing one or more embodiments of any component disclosed herein. The computer 1200 includes a processor 1202 (which may be referred to as a central processor unit or CPU) that is in communication with memory devices including secondary storage 1204, read only memory (ROM) 1206, random access memory (RAM) 1208, input/output (I/O) devices 1210, and network connectivity devices 1212. The processor may be implemented as one or more CPU chips, or may be part of one or more application specific integrated circuits (ASICs).

The secondary storage 1204 is typically comprised of one or more disk drives or tape drives and is used for non-volatile storage of data and as an over-flow data storage device if RAM 1208 is not large enough to hold all working data. Secondary storage 1204 may be used to store programs that are loaded into RAM 1208 when such programs are selected for execution. The ROM 1206 is used to store instructions and perhaps data that are read during program execution. ROM 1206 is a non-volatile memory device that typically has a small memory capacity relative to the larger memory capacity of secondary storage 1204. The RAM 1208 is used to store volatile data and perhaps to store instructions. Access to both ROM 1206 and RAM 1208 is typically faster than access to secondary storage 1204.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An apparatus comprising:
    a header comprising a platform for attaching opto-electronic components;
    an optical element;
    a laser diode (LD) comprising a front facet, wherein the LD is configured to emit an optical signal from the front facet that passes through the optical element; and
    a cap affixed to the header such that the cap is coaxially aligned with the header, wherein the cap and header encase the optical element and the LD,
    wherein the optical element is configured to monitor or correct, or both, an optical characteristic of the optical signal.

2. The apparatus of claim 1, further comprising a photodiode (PD) encased by the cap and the header and configured to monitor the optical signal as it emerges from the optical element and determine the optical characteristic of the optical signal, and wherein the optical element monitors the optical signal without correcting by providing wavelength tuning information.

3. The apparatus of claim 2 further comprising a temperature regulator encased by the cap and the header and configured to regulate the temperature of the optical element based on the optical element's performance and minimize the temperature difference between the LD and the optical element by adjusting the temperature of the optical element.

4. The apparatus of claim 3, wherein the optical element is between about one millimeter and about two millimeters in width, length, and thickness, and wherein the micro-regulator comprises a length, width, or thickness that is between about one millimeter and about two millimeters.

5. The apparatus of claim 2, wherein the optical characteristic comprises a wavelength of the optical signal, wherein the optical element corrects the optical signal without monitoring by filtering the optical signal to obtain a desired wavelength range, and wherein the PD gauges performance of the optical element by determining whether the wavelength of the optical signal is within the desired wavelength range.

6. An apparatus comprising:
    a header comprising a platform for attaching opto-electronic components;
    an optical element;
    a laser diode (LD) configured to emit an optical signal that passes through the optical element; and
    a cap affixed to the header such that the cap is coaxially aligned with the header, wherein the cap and header encase the optical element and the LD,
    wherein the optical element comprises a thin film filter, and wherein the temperature regulator is a micro-regulator configured regulate the temperature of the thin film filter without substantially affecting the temperature of the LD.

7. The apparatus of claim 6, wherein the micro-regulator comprise one of a micro-thermo-electric cooler (micro-TEC) and a micro-resistance heater.

8. An apparatus comprising:
a header comprising a platform for attaching opto-electronic components;
an optical element;
a laser diode (LD) configured to emit an optical signal that passes through the optical element;
a cap affixed to the header such that the cap is coaxially aligned with the header, wherein the cap and header encase the optical element and the LD;
a collimate lens encased by the cap and the header and positioned between the LD and the optical element, wherein the optical signal passes through the collimate lens before passing the optical element; and
a focal lens encased by the cap and the header, wherein the optical element is positioned between the collimate lens and the focal lens, and wherein the optical signal passes through the focal lens after passing through the optical element.

9. The apparatus of claim 8, further comprising an edge-illuminated photodiode (PD) encased by the cap and the header and positioned between the optical element and the focal lens, wherein the edge-illuminated PD is configured to capture only a portion of the optical signal as the optical signal emerges from the optical element, and wherein a remaining portion of the optical signal passes through the focal lens.

10. The apparatus of claim 9, wherein the edge-illuminated PD is adjustable such that the portion of the optical signal captured by the edge-illuminated PD may be increased or decreased by changing the edge-illuminated PD's relative position with respect to the center of the optical signal.

11. The apparatus of claim 9, further comprising a PD encased by the cap and the header and positioned behind the LD, wherein the PD is configured to determine an optical characteristic of the optical signal, and wherein the apparatus does not comprise any optical beam splitters.

12. The apparatus of claim 11, wherein the optical signal is emitted from a front facet of the LD, wherein a second optical signal comprising substantially similar characteristics to the optical signal is emitted from a rear facet of the LD, and wherein the PD monitors the second optical signal to determine the optical characteristic of the optical signal.

13. The apparatus of claim 12, further comprising a mirror encased by the cap and the header and positioned between the collimate lens and the optical element, wherein the mirror is configured to reflect the optical signal towards the optical element after the optical signal emerges from the collimate lens.

14. A transistor outline (TO-can) package, comprising:
a header;
a cap coupled to the header and coaxially aligned to the header;
a first lens mounted inside the cavity formed between the cap and the header, wherein the first lens is configured to collimate the optical signal; and
a laser diode (LD) mounted inside the cavity formed between the cap and header, wherein the LD is configured to emit an optical signal that passes through the first lens.

15. The apparatus of claim 14, wherein the apparatus of claim 14 further comprises an optical element, and wherein the collimated optical signal passes through the optical element, and wherein the optical element is configured to filter the collimated optical signal.

16. An opto-electronic package, comprising:
a header for mounting opto-electronic components;
a cap affixed to the header such that the cap and the header are coaxially aligned;
a laser diode (LD) configured to emit a first optical signal from a front facet and a second optical signal from a rear facet, and wherein the first optical signal and the second optical signal comprise substantially similar optical characteristics;
a first photodiode (PD) configured to determine the second optical signal's wavelength;
an optical element configured to filter the first optical signal, wherein the temperature of the optical element is regulated based on the optical element's performance; and
a second PD configured to determine the first optical signal's wavelength as the first optical signal emerges from the optical element,
wherein the optical element's performance is determined by comparing the first optical signal's wavelength with the second optical signal's wavelength, and
wherein each of the LD, the first PD, the optical element, and the second PD are encased within a cavity formed between the cap and the header.

17. The apparatus of claim 1, further comprising a mirror encased by the cap and the header, wherein the mirror is positioned between the LD and the optical element such that the optical signal is bent about a 90 degree angle when the optical signal is reflected off the mirror towards the optical element.

18. The apparatus of claim 14, further comprising a mirror mounted inside the cavity formed between the cap and header, wherein the mirror is configured to reflect the collimated optical signal such that the reflected optical signal is not traveling in a direction parallel to the collimated optical signal.

19. The apparatus of claim 15, further comprising a first photodiode (PD), wherein the first PD is mounted inside the cavity formed between the cap and header, and wherein the second PD is configured to monitor the collimated optical signal after the collimated optical signal emerges from the optical element.

20. The apparatus of claim 19, wherein the first PD is further configured to determine whether the optical signal's wavelength shifted during filtering by the optical element.

21. The apparatus of claim 19, further comprising a second PD mounted inside the cavity formed between the cap and header, wherein the second PD is configured to monitor a second optical signal emitted from the LD.

* * * * *

UNITED STATES PATENT AND TRADEMARK OFFICE
CERTIFICATE OF CORRECTION

PATENT NO. : 8,477,822 B2  Page 1 of 1
APPLICATION NO. : 13/223496
DATED : July 2, 2013
INVENTOR(S) : Rongshong Miao It is certified that error appears in the above-identified patent and that said Letters Patent is hereby corrected as shown below:

In the Claims:

Column 11/Line 2/Claim 6 should read: "configured to regulate the temperature of the thin film filter"

Column 11/Line 6/Claim 7 should read: "comprises one of a micro-thermo-electric cooler (micro-TEC)"

Signed and Sealed this
Sixth Day of August, 2013

Teresa Stanek Rea
*Acting Director of the United States Patent and Trademark Office*